United States Patent
Grupp et al.

(10) Patent No.: US 7,084,423 B2
(45) Date of Patent: Aug. 1, 2006

(54) METHOD FOR DEPINNING THE FERMI LEVEL OF A SEMICONDUCTOR AT AN ELECTRICAL JUNCTION AND DEVICES INCORPORATING SUCH JUNCTIONS

(75) Inventors: Daniel E. Grupp, Palo Alto, CA (US); Daniel J. Connelly, Redwood City, CA (US)

(73) Assignee: Acorn Technologies, Inc., Pacific Palisades, CA (US)

( * ) Notice: Subject to any disclaimer, the term of this patent is extended or adjusted under 35 U.S.C. 154(b) by 377 days.

(21) Appl. No.: 10/217,758

(22) Filed: Aug. 12, 2002

(65) Prior Publication Data

US 2004/0026687 A1 Feb. 12, 2004

(51) Int. Cl.
*H01L 39/00* (2006.01)
*H01L 31/108* (2006.01)

(52) U.S. Cl. .......................................... 257/30; 257/485
(58) Field of Classification Search ................... 257/30, 257/31, 32, 35, 56, 62, 65, 471, 472, 473, 257/475, 485
See application file for complete search history.

(56) References Cited

U.S. PATENT DOCUMENTS

| | | |
|---|---|---|
| 3,590,471 A | 7/1971 | Lepselter et al. |
| 3,708,360 A | 1/1973 | Wakefield, Jr. et al. |
| 3,983,264 A | 9/1976 | Schroen et al. |
| 4,056,642 A | 11/1977 | Saxena et al. |
| 4,300,152 A | 11/1981 | Lepselter |
| 4,485,550 A | 12/1984 | Koeneke et al. |
| 4,583,110 A * | 4/1986 | Jackson et al. ............. 257/734 |
| 5,021,365 A | 6/1991 | Kirchner et al. |
| 5,098,859 A * | 3/1992 | Jackson et al. ............. 438/509 |
| 5,399,206 A | 3/1995 | de Lyon |
| 5,578,848 A | 11/1996 | Kwong et al. |
| 5,596,218 A | 1/1997 | Soleimani et al. |
| 5,612,567 A | 3/1997 | Baliga |
| 5,663,584 A | 9/1997 | Welch |
| 5,801,398 A | 9/1998 | Hebiguchi |
| 5,888,891 A | 3/1999 | Gould |
| 5,939,763 A | 8/1999 | Hao et al. |
| 6,037,605 A | 3/2000 | Yoshimura |
| 6,096,590 A | 8/2000 | Chan et al. |
| 6,150,286 A | 11/2000 | Sun et al. |

(Continued)

FOREIGN PATENT DOCUMENTS

| | | |
|---|---|---|
| EP | 0 295 490 | 5/1988 |
| EP | 0 789 388 | 8/1996 |

OTHER PUBLICATIONS

M.C. Gilmer et al., "Process and Manufacturing Challenges for High–K Gate Stack Systems", Mat. Res. Soc. Symp. Proc. vVol. 567, (1999), pp. 323–341.

John P. Snyder et al., "Experimental Investigation of a PtSi Source and Drain Field Emission Transistor", American Institute of Physics, pp. 1–3.

(Continued)

*Primary Examiner*—Ngân V. Ngô
(74) *Attorney, Agent, or Firm*—Blakely Sokoloff Taylor & Zafman LLP

(57) ABSTRACT

An electrical device in which an interface layer is disposed between and in contact with a metal and a Si-based semiconductor, the interface layer being of a thickness effective to depin of the Fermi level of the semiconductor while still permitting current to flow between the metal and the semiconductor. The interface layer may include a layer of a passivating material (e.g., made from nitrogen, oxygen, oxynitride, arsenic, hydrogen and/or fluorine) and sometimes also includes a separation layer. In some cases, the interface layer may be a monolayer of a semiconductor passivating material. The interface layer thickness corresponds to a minimum specific contact resistance of less than or equal to 10 $\Omega\text{-}\mu m^2$ or even less than or equal to 1 $\Omega\text{-}\mu m^2$ for the electrical device.

69 Claims, 6 Drawing Sheets

U.S. PATENT DOCUMENTS

| | | | |
|---|---|---|---|
| 6,198,113 B1 | 3/2001 | Grupp | |
| 6,207,976 B1 | 3/2001 | Takahashi et al. | |
| 6,261,932 B1 | 7/2001 | Hulfachor | |
| 6,291,866 B1 | 9/2001 | Wallace et al. | |
| 6,291,867 B1 | 9/2001 | Wallace et al. | |
| 6,303,479 B1 | 10/2001 | Snyder | |
| 2003/0127700 A1 * | 7/2003 | Moddel et al. | 257/425 |

OTHER PUBLICATIONS

Chung–Kuang Huang, Wei E. Zhang and C. H. Yang, "Two–Dimensional Numerical Simulation of Schottky Barrier MOSFET with Channel Length to 10 nn", IEEE, pp. 842–848.

S. Hara et al., "Control of Schoffky and Ohmic Interfaces by Unpinning Fermi Level", Elsevier Science B.V., pp. 394–399.

S. Hara et al., Pinning–Controlled Ohmic Contacts: Application to SiC(0001), Elsevier Science B.V., pp. 218–221.

S. Hara, et al., "Pinning–Controlled Metal/Semiconductor Interfaces", Electrotechnical Laboratory, pp. 802–807.

http://www.rciqu.hokudai.ac.ip/RCIQEold/Research-Achievements.html, downloaded on Apr. 12, 2002.

I. Shalish et al., "Yellow Luminescence and Fermi Level Pinning in GaN Layers", American Institute of Physics, vol. 77, No. 7, (Aug. 14, 2000) pp. 987–989.

Andreas Mandelis and R. Arief Budiman, "Evidence of a Surface Acceptor State in Undoped Semi–Insulating GaAs by Photothermal Radiometric Deep Level Transient Spectroscopy", Sociedad Mexicana de Ciencias de Superficies y de Vacio, (1999) pp. 13–17.

Takhee Lee, Jai Liu, Nien–Po Chen, R.P. Andreas, D.B. Janes, and R. Reifenberger; "Electronic Property of Metallic Nanoclusters on Semiconductor Surfaces: Implications for Nanoelectronic Device Applications"; Journal of Nanoparticle Research 2; pp. 345–362; 2000.

Y.K. Kim and Sehun Kim; "Metal–Dependent Fermi–Level Movement in the Metal/Sulfer–Passivated InGaP Contact"; J. Vac Sci. Technol. A 15(3); pp. 1124–1128; May/Jun. 1997.

Hideki Hasegawa, Taketomo Sate, Seiya Kasai; "Unpinning of Fermi Level in Nanometer–Sized Schottky Contacts on GaAs and InP"; Research Center for Interface Quantum Electronics and Graduate School of Electronics and Info. Eng, Hokkaido Univ., Japan; pp. 92–96; 2000.

P. Bauernschmitt et al; "Yb–SiO$_2$–Si Tunneling Junctions"; Elsevier Publishers B.V.; pp. 105–108; 1993.

Naoya Okamoto, Tsuyoshi Takahshi, Tanaka & Masahiko Takikawa; "Near–Ohmic Contact of n–GaAs with Ga/GaAs Qualsi–Metal–Insulator–Semiconductor Structure"; Jpn. J. Appl. Phys., vol. 37 (1998) pp. 32483251.

J. Tersoff; "Schottky Barrier Heights and the Continuum of Gap States" Physical Review Letters, vol. 52, No. 6; Feb. 6, 1984; AT &T Bell Lab., Murphy Jill, New Jersey 07974.

Volker Heine; "Theory of Surface States"; Physical Review Letters, vol. 138 No. 6A, Jun. 4, 1965; Tell Telephone Lab., Murphy Jill, New Jersey.

Steven G. Louie, James R. Chelokowsky, Marvin L. Cohen; "Ioncity and the Theory of Schottky Barriers"; Physical Review Letters, vol. 15 No. 4, Feb. 15, 1977; Dept. of Phys. Univ. of California, and Materials and Molecular Research Div., Lawrence Berkley Lab., Berkley, CA 94720.

W.E. Spicer, I. Lindau, P. Skeath, C.Y. Su, Patrick Chye; "Unified Mechanism for Schottky–Barrier Formation and III–V Oxide Interface States"; Physical Review Letters, vol. 44, No. 6, Stanford Electronics Lab., Stanford Univ., Stanford, CA 94305; Feb. 11, 1980, pp. 420–423.

D..J. Chadi, P.H. Citrin, C.H. Park, D.L. Adler, M.A. Marcus, H.J. Gossman; "Fermi–Level–Pinning Defects in Highly n–Doped Silicon"; Physical Review Letters, vol. 79, No. 24, Dec. 1997; NEC Research Institute, Princeton, New Jersey 08540–6634; pp. 4834–4837.

R.A. McKee, F.J. Walker, M.F. Chisholm; "Physical Structure and Inversion Charge at a Semiconductor Interface with a Crystalline Oxide"; www.sciencemag.org, vol. 293; Jul. 20, 2001; pp. 468–469.

F.A. Padovani; "Forward Voltage–Current Characteristics of Metal–Silicon Schottky Barriers"; Texas Instruments, Inc., Dallas Texas; Sep. 15, 1966; pp. 892–892.

R.T. Tung; Electron Transport of Inhomogeneous Schottky Barriers; AT & T Bell Lab., Murray hill, New Jersey 07974; Mar. 21, 1991; 3832–3834.

M. Miyawak, I S. Yoshitake, Tadahiro Ohmi; "Improvement of Aluminum–Si Contact Performance in Native–Oxide–Free Processing"; IEEE Electron Device Letters, vol. 11, No. 10, Oct. 1990; pp. 448–450.

Mitsuteru Kinura; Tadashi Matusadate; "A New Type of Schottky Tunnel Transistor"; IEEE Electron Device Letters, vol. 15, No. 10; Oct. 1994; pp. 412–414.

Feng–Jung Huang, K.K.O.; "Metal–Oxide Semiconductor field–Effect Transistors Using Schottky Barrier Drains"; Electronics Letters, vol. 33, No. 15; Jul. 17, 1997; pp. 1341–1342.

Lie Wang and M.I. Nathan; "High BARRIER GaN Schottky Diodes: Pt/GaN and Pd/GaN"; Dept. of Electrical Eng., Univ. of Minnesota, Minneapolis, Minnesota 55455; Appl. Phys. Letters, vol. 68 (9); Feb. 26, 1996, pp. 1257–1270.

B.J. Zhang, T. Egawa, G. Y. Zhao, H. Ishikawa, M. Umeno; "Schottky Diodes of Ni/Au on n–GaN Grown on Sapphire and SiC Substrates"; Applied Physics Letters, vol. 79, No. 16; Oct. 15, 2001; pp. 2567–2569.

Satoshi Kamiyama, Pierr–Yves Lesaicherre, Hiroshi Suziki, Akira Sakai, Iwao Nishiyama, Akijiko Ishitani; "Ultrathin Tantalum Odise Capacitor DIELECTRIC Layers Fabricated Using Rapid Thermal Nitridation Prior to Low Pressure Chemical Vapor Deposition"; J. Electrochem. Soc., vol. 140, No. 6; Jun. 1993; The Electrochemical society, inc.; p. 1617.

C. Chaneloere, J.L. Autran, R.A.B. Devine, B. Balland; "Tantalum Pentoxide (Ta$_2$O$_5$) Thin Films for Advanced Dielectric Applications"; Reports: a Review Journal; Materials Science and Engineering, R22 (1998) 269–322.

G.B. Akers, L.A. Sturling, R.B. Vandover, J.P. Chang, D.J. Werder, R.Urddahl, R.Rajopalan; "Effects of Thermal Stability and Roughness on Electrical Properties of Tantalus Oxide Gates"; Mat. Res., Soc. Symp. Proc, vol. 567 1999 Materials Research Society; pp. 391–395.

Hanyang Yang, Hiro Niimi, Jeff W. Keister, Gerald Lucovsky, Jacke. Rowe; "The Effects of Interfacial Sub–Oxide Transition Regions and Monolayer Level Nitridation on Tunneling Currents in Silicon Devices"; IEEE Electron Device Letters, vol. 21, No. 2; Feb. 2000; pp. 76–78.

R.D. Bringanss; "Arsenic Passivation of Si and Ge Surfaces"; Critical Reviews in Solid State and Materials Sciences, 17(4): 353–395 (1992); pp. 353–395.

J.R. Patel, J.A. Golovchenko, P.E. Freeland, H.J. Gossmann; "Arsenic Atom Location on Passive Silicon (111) Surfaces"; Physical Review B. vol., 36, No. 14; Nov. 15, 1987; pp. 7715–7717.

U.J.R. Baumvol; "Atomic Transport During Growth of Ultrathin Dielectrics on Silicon"; Surface Science Reports 36 (1999) I–166.

S. Verhacerbeke, J. Alay, P. Mertens, M. Meuris, M. Heyns, W. Vandervoues, M. Murrel, S. Sofield; Surface Characterization of Si After HF Treatments and its Influence in the Dielectric Breakdown of Thermal Oxides; Research Aspirant of the Belgium National Fund for Scientific Research; Mat. Res. Soc. Symp. Proc., vol. 259; 1992 Material Research Society; pp. 391–399.

T.I. Kamins, K. Nauka; "Effect of Hydrogen on p–Type Epitaxial Silicon Sheet–Resistance Measurements"; Electrochemical and Solid–State Letters 1(2) 100–101 (1998); pp. 100–101.

Peter J. Wright, Naiki Kasai; "Hot–Electron Immunity of $SiO_2$ Dielectrics with Fluorin Incorporation"; IEEE Electron Device Letters, vol. 10, No. 8, Aug. 8, 1989; pp. 347–348.

Yasushiro Noshioka, Yuzuru Ohji, Kiichiro Mukai; "Dielectric Characteristics of Forinated Ultradry $SiO_2$"; Appl. Phy. Letters 54(12); Mar. 20, 1989; pp. 1127–1129.

C.L. Chen, T.S. Chao, C.S. Lai, T.Y. Huang; "High Quality Native–Oxide–Free Untrathin Oxide Grown by In–Situ HF–Vapor Treatment"; Electronic Letters, vol. 36, No. 11; pp. 981–983; May 25, 2000.

J. Hilsenbeck, E. Nebauer, J. Würfl, Tränkle, H. Obloh; "Aging Behavior of Algan HFETs with Advanced Ohmic and Schottky Contacts"; Electronic letters, vol. 36, No. 11; pp. 980–981; May 25, 2000.

Hiroto Izumi, Stella Chemifa; "43. Hydrogen Termination: The Ideally Finished Silicon Surface"; Ultraclean Surface Processing of Silicon Wafers; Secrets of VLsi Manufacturing http://halloftechnology.com/electrical_optical/986.shtml; Nov. 1998.

K. Nauka, T.I. Kamins; "Surface Photovoltage Measurement of Hydrogen–Treated Si Surfaces"; Journal of Electrochemical Society, 146 (1) 292–295 (1999.

E. Yablonovitch, D.L. Allara, C.C. Chang, T. Gmitter, T.B. Bright; "Unusually low Surface–Recombination Velocity on Silicon and Germanium Surfaces"; Physical Review Letters, vol. 57, No. 2, pp. 249–252; Jul. 14, 1986.

B.R. Weinberger, G.G. Peterson, T.C. Escrich, H.A. Krasinski; "Surface Chemistry of HF Passivation Silicon: X–Ray Photoelectron and Ion Scattering Spectroscopy Results"; J. Appl. Phys. 60(9), pp. 3232–3234; Nov. 1, 1986.

Lahir Shaik Adam, Mark E. Law; "Experimental Identification of Nitrogen–Vacancy Complexes in Nitrogen Implanted Silicon"; Applied Physics Letters, vol. 79, No. 5, pp. 623–625; Jul. 30, 2001.

R.M.C. De Almeida, I.R.J. Baumvol; "Reaction–Diffusion Model for Thermal Growth of Silicon Nitrite Films on Si"; Physical Review B, vol. 62, No. 24, pp. R16 255–R16 258; Dec. 15, 2000.

Yuniarto Widjaja, Michael M. Mysinger, Charles B. Musgrave; Ab Initlo Study and Decomposition of $NH_3$ on Si(100)–(2×1); J. Phy. Chem B 2000; pp. 2527–2533.

Armin G. Aberle, Thomas Lauinger, Jan Schmidt, Rudolf Hezel; "Injection–Level Dependent Surface Recombination Velocities at the Silicon–Plasma Silicon Nitrite Interface"; Institut für Solaernergieforschung, ISFH, D–3 1860 Emmerthal, Germany; pp. 2828–2830; Mar. 9, 1995.

L. Cai, A. Rohatgi, G. May; "Investigation of the Properties of Plasma–Enhanced Chemical Vapor Deposition Silicon Nitrite and its effect on Silicon Surface Passivation"; Journal of Applied Physics, vol. 83, No. 11, pp. 5885–5889; Jun. 1, 1998.

Jan Schmidt, Armin G. Abele; "Carrier Recombination at Silicon–Silicon Nitride Interfaces Fabricated by Plasma–Enhanced Chemical Vapor Deposition"; Journal of Applied Physics, vol. 85, No. 7, pp. 3626–3633; Apr. 1, 1999.

Y. Hayafuji, K. Kajiwara; "Nitridation of Silicon and Oxidized–Silicon"; Sony Corp. Research Center, 174 Fujitsuka–Cho, Hodogaya–Ku, Yokohama, 240 Japan; J. Electrochem. Soc.: Solid State Science and Technology; Sep. 1982.

S.A. Wolf, D.D. Awschalom, R.A. Buhrman, J.M. Daughton, S. Von Molnar, M.L. Roukes, A.Y. Chtchelkanova, D.M. Treger; "Spintronics: A Spin–Based Vision for the Future"; www.sciencemag.org, vol. 294, pp. 1488; Nov. 16, 2001.

International Search Report, (Dec. 3, 2003), pp. 8.

M. A. Sobolewski, et al., "Properties of Ultrathin Thermal Nitrides In Silicon Schottky Barrier Structures", Applied Physics Letters, American Institute of Physics, vol. 54, No. 7, (2/13/89J), pp. 638–640.

T. Teraji, et al., "Ohmic Contacts To N. Type 6H.SIC Without Post–Annealing", Materials Research Society Symposium Proceeding, (Apr. 8, 1996), pp. 149–154.

S. M. Sze, "Metal–Semiconductor Contacts", Physics of Semiconductor Devices, John Wiley & Sons, 1981, pp. 245–311.

L. M. Porter, "A Critical Review of Ohmic and Rectifying Contacts For Silicon Carbide", Materials Science and Engineering, vol. 34, No. 2 (Nov. 1, 1995), pp. 83–105.

* cited by examiner

METHOD FOR DEPINNING THE FERMI LEVEL OF A SEMICONDUCTOR AT AN ELECTRICAL JUNCTION AND DEVICES INCORPORATING SUCH JUNCTIONS

RELATED APPLICATIONS

The present application is related to co-pending U.S. patent application No. 10/342,576, entitled "INSULATED GATE FIELD EFFECT TRANSISTOR HAVING PASSIVATED SCHOTTKY BARRIERS TO THE CHANNEL", filed on Jan. 14, 2003 by the present inventors and assigned to the same assignee as the present application. This related patent application is hereby incorporated by reference in its entirety.

FIELD OF THE INVENTION

The invention relates generally to semiconductor processing and semiconductor devices. More particularly, the invention relates to a process for depinning the Fermi level of a semiconductor at a metal-interface layer-semiconductor junction and to devices that employ such a junction.

BACKGROUND

One of the most basic electrical junctions used in modern devices is the metal-semiconductor junction. In these junctions, a metal (such as aluminum) is brought in contact with a semiconductor (such as silicon). This forms a device (a diode) which can be inherently rectifying; that is, the junction will tend to conduct current in one direction more favorably than in the other direction. In other cases, depending on the materials used, the junction may be ohmic in nature (i.e., the contact may have negligible resistance regardless of the direction of current flow). Grondahl and Geiger first studied the rectifying form of these junctions in 1926, and by 1938 Schottky had developed a theoretical explanation for the rectification that was observed.

Schottky's theory explained the rectifying behavior of a metal-semiconductor contact as depending on a barrier at the surface of contact between the metal and the semiconductor. In this model, the height of the barrier (as measured by the potential necessary for an electron to pass from the metal to the semiconductor) was postulated as the difference between the work function of the metal (the work function is the energy required to free an electron at the Fermi level of the metal, the Fermi level being the highest occupied energy state of the metal at T=0) and the electron affinity of the semiconductor (the electron affinity is the difference between the energy of a free electron and the conduction band edge of the semiconductor). Expressed mathematically:

$$\Phi_B = \Phi_M - X_S \quad [1]$$

where $\Phi_B$ is the barrier height, $\Phi_M$ is the work function of the metal and $X_S$ is the electron affinity of the semiconductor.

Not surprisingly, many attempts were made to verify this theory experimentally. If the theory is correct, one should be able to observe direct variations in barrier heights for metals of different work functions when put in contact with a common semiconductor. What is observed, however, is not direct scaling, but instead only a much weaker variation of barrier height with work function than implied by the model.

Bardeen sought to explain this difference between theoretical prediction and experimental observation by introducing the concept that surface states of the semiconductor play a role in determining the barrier height. Surface states are energy states (within the bandgap between the valence and conduction bands) at the edge of the semiconductor crystal that arise from incomplete covalent bonds, impurities, and other effects of crystal termination. FIG. 1 shows a cross-section of an un-passivated silicon surface labeled 100. The particular silicon surface shown is an Si(100) 2×1 surface. As shown, the silicon atoms at the surface, such as atom 110, are not fully coordinated and contain un-satisfied dangling bonds, such as dangling bond 120. These dangling bonds may be responsible for surface states that trap electrical charges.

Bardeen's model assumes that surface states are sufficient to pin the Fermi level in the semiconductor at a point between the valence and conduction bands. If true, the barrier height at a metal-semiconductor junction should be independent of the metal's work function. This condition is rarely observed experimentally, however, and so Bardeen's model (like Schottky's) is best considered as a limiting case.

For many years, the cause underlying the Fermi level pinning of the semiconductor at a metal-semiconductor junction remained unexplained. Indeed, to this day no one explanation satisfies all experimental observations regarding such junctions. Nevertheless, in 1984, Tersoff proposed a model that goes a long way towards explaining the physics of such junctions. See J. Tersoff, "Schottky Barrier Heights and the Continuum of Gap States," Phys. Rev. Lett. 52 (6), Feb. 6, 1984.

Tersoff's model (which is built on work by Heine and Flores & Tejedor, and see also Louie, Chelikowsky, and Cohen, "Ionicity and the theory of Schottky barriers," Phys. Rev. B 15, 2154 (1977)) proposes that the Fermi level of a semiconductor at a metal-semiconductor interface is pinned near an effective "gap center", which is related to the bulk semiconductor energy band structure. The pinning is due to so-called metal induced gap states (MIGS), which are energy states in the bandgap of the semiconductor that become populated due to the proximity of the metal. That is, the wave functions of the electrons in the metal do not terminate abruptly at the surface of the metal, but rather decay in proportion to the distance from that surface (i.e., extending inside the semiconductor). To maintain the sum rule on the density of states in the semiconductor, electrons near the surface occupy energy states in the gap derived from the valence band such that the density of states in the valence band is reduced. To maintain charge neutrality, the highest occupied state (which defines the Fermi level of the semiconductor) will then lie at the crossover point from states derived from the valence band to those derived from the conduction band. This crossover occurs at the branch point of the band structure. Although calculations of barrier heights based on Tersoff's model do not satisfy all experimentally observed barrier heights for all metal-semiconductor junctions, there is generally good agreement for a number of such junctions.

One final source of surface effects on diode characteristics is inhomogeneity. That is, if factors affecting the barrier height (e.g., density of surface states) vary across the plane of the junction, the resulting properties of the junction are found not to be a linear combination of the properties of the different regions. In summary then, a classic metal-semiconductor junction is characterized by a Schottky barrier, the properties of which (e.g., barrier height) depend on surface states, MIGS and inhomogeneities.

The importance of the barrier height at a metal-semiconductor interface is that it determines the electrical properties of the junction. Thus, if one were able to control or adjust the barrier height of a metal-semiconductor junction, one could produce electrical devices of desired characteristics. Such barrier height tuning may become even more important as device sizes shrink even further. Before one can tune the barrier height, however, one must depin the Fermi level of the semiconductor. As discussed in detail below, the present inventors have achieved this goal in a device that still permits substantial current flow between the metal and the semiconductor.

SUMMARY OF THE INVENTION

The present inventors have determined that for thin interface layers disposed between a metal and a silicon-based semiconductor (e.g., Si, SiC and SiGe), so as to form a metal—interface layer—semiconductor junction, there exist corresponding minimum specific contact resistances. The interface layer thickness corresponding to this minimum specific contact resistance will vary depending upon the materials used, however, it is a thickness that allows for depinning the Fermi level of the semiconductor while still permitting current to flow between the metal and the semiconductor when the junction is biased (e.g., forward or reverse biased). By depinning the Fermi level, the present inventors mean a condition wherein all, or substantially all, dangling bonds that may otherwise be present at the semiconductor surface have been terminated, and the effect of MIGS has been overcome, or at least reduced, by displacing the semiconductor a sufficient distance from the metal. Minimum specific contact resistances of less than or equal to approximately 10 $\Omega\text{-}\mu m^2$ or even less than or equal to approximately 1 $\Omega\text{-}\mu m^2$ may be achieved for such junctions in accordance with the present invention.

Thus, in one embodiment, the present invention provides an electrical device in which an interface layer is disposed between and in contact with a metal and a silicon-based semiconductor and is configured to depin the Fermi level of the: semiconductor while still permitting current flow between the metal and the semiconductor when the electrical device is biased. The specific contact resistance of the electrical device is less than approximately 10 $\Omega\text{-}\mu m^2$. The interface layer may include a passivating material (e.g., a nitride, oxide, oxynitride, arsenide, hydride and/or fluoride) and sometimes also includes a separation layer. In some cases, the interface layer may be essentially a monolayer (or several monolayers) of a semiconductor passivating material.

In another embodiment, the interface layer is made up of a passivation layer fabricated by heating the semiconductor in the presence of nitrogenous material, for example ammonia ($NH_3$), nitrogen ($N_2$) or unbound gaseous nitrogen (N) generated from a plasma process. In such cases, the interface layer may be fabricated by heating the semiconductor while in a vacuum chamber and exposing the semiconductor to the nitrogenous material.

A further embodiment of the present invention provides for depinning the Fermi level of a semiconductor in an electrical junction through the use of an interface layer disposed between a surface of the semiconductor and a conductor. The interface layer preferably (i) is of a thickness sufficient to reduce effects of MIGS in the semiconductor, and (ii) passivates the surface of the semiconductor. Despite the presence of the interface layer, significant current may flow between the conductor and the semiconductor because the thickness of the interface layer may be chosen to provide a minimum (or near minimum) specific contact resistance for the junction. As indicated above, the interface layer may include a passivating material such as a nitride, oxide, oxynitride, arsenide, hydride and/or fluoride.

Further embodiments of the present invention provide a junction between a semiconductor and a conductor separated from the semiconductor by an interface layer configured to allow a Fermi level of the conductor to (i) align with a conduction band of the semiconductor, (ii) align with a valence band of the semiconductor, or (iii) to be independent of the Fermi level of the semiconductor. In some or all of these cases, current may flow between the conductor and the semiconductor when the junction is biased because the interface layer has a thickness corresponding to a minimum or near minimum specific contact resistance for the junction. For example, specific contact resistances of less than or equal to approximately 2500 $\Omega\text{-}\mu m^2$, 1000 $\Omega\text{-}\mu m^2$, 100 $\Omega\text{-}\mu m^2$, 50 $\Omega\text{-}\mu m^2$, 10 $\Omega\text{-}\mu m^2$ or even less than or equal to 1 $\mu m^2$ may be achieved.

BRIEF DESCRIPTION OF THE SEVERAL VIEWS OF THE DRAWINGS

The present invention is illustrated by way of example, and not by way of limitation, in the figures of the accompanying drawings.

DETAILED DESCRIPTION

Figure 1:
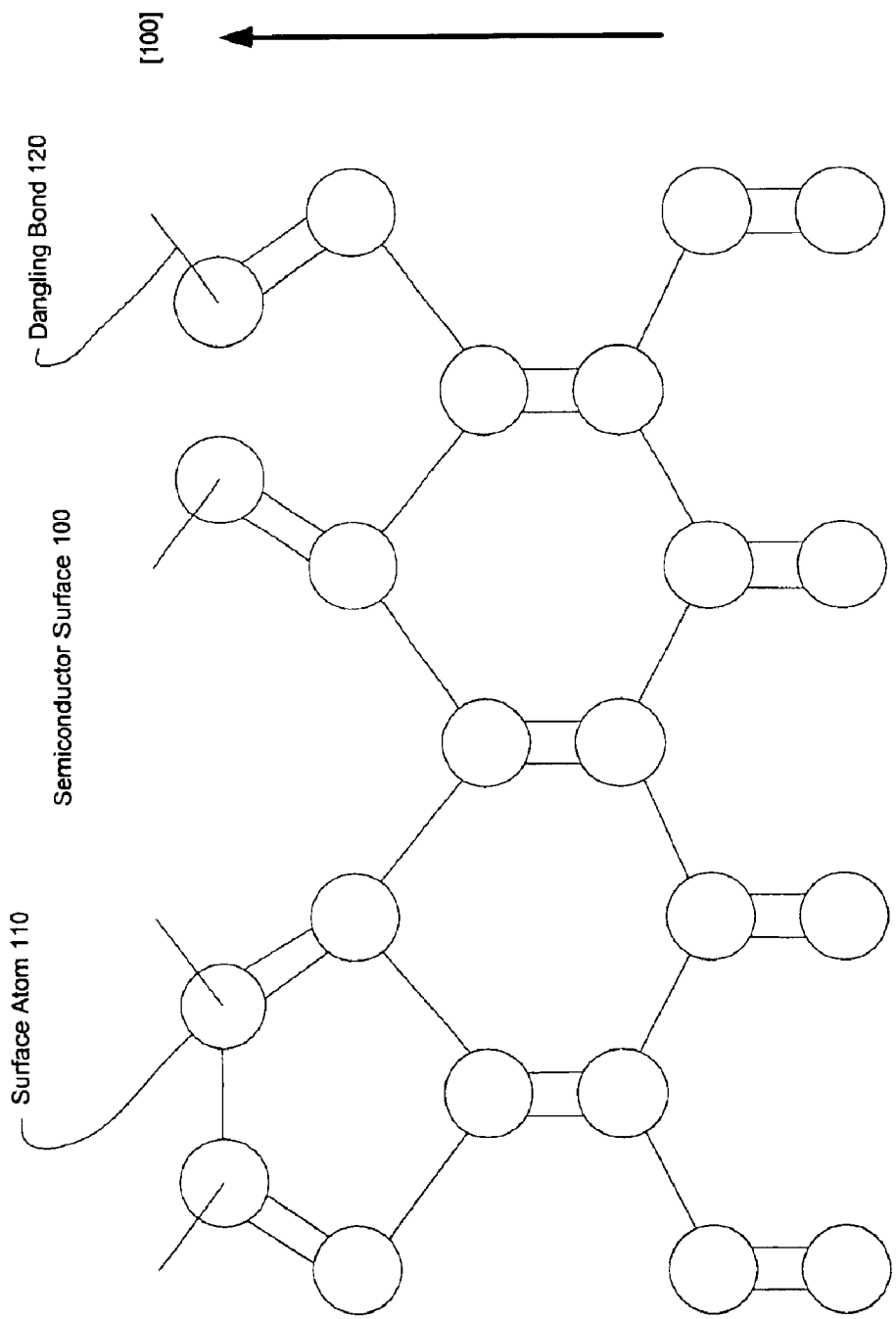
FIG. 1 shows a cross-section of an un-passivated silicon surface containing surface silicon atoms with dangling bonds.

Described herein are processes for depinning the Fermi level of a silicon-based semiconductor (e.g., Si, SiC or SiGe) at a metal-semiconductor junction as well as devices that use such a junction. As more fully discussed below, an interface layer is introduced between the semiconductor and the metal. The interface layer functions to passivate the semiconductor surface (that is, terminate dangling bonds that may otherwise be present at the semiconductor surface so as to assure chemical stability of the surface) and to displace the semiconductor from the metal so as to reduce the effect of MIGS.

As discussed more fully below, the present inventors have determined that for thin interface layers disposed between a metal and a silicon-based semiconductor (e.g., Si, SiC and SiGe), so as to form a metal—interface layer—semiconductor junction, there exist corresponding minimum specific contact resistances. Indeed, minimum specific contact resistances of less than or equal to approximately 10 $\Omega$-$\mu m^2$ or even less than or equal to approximately 1 $\Omega$-$\mu m^2$ may be achieved for such junctions in accordance with the present invention. To achieve such low contact resistances, a metal that has a work function near the conduction band of the semiconductor for n-type semiconductors, or a work function that is near the valence band for p-type semiconductors, is selected.

The Schottky barrier in such junctions is already minimized, meaning that it is much less than the Schottky barrier presented by a junction in which the Fermi level is pinned, generally near the middle of the semiconductor's bandgap. The current versus voltage (IV) characteristic of these junctions is nonlinear, generally having a slope that increases as the voltage increases, such that the derivative of current with respect to voltage is increasing with voltage. This results in a decreasing differential resistance (dV/dI) and a decreasing resistance (V/I). Thus, a junction that has high resistance or high differential resistance near the origin of the IV characteristic (zero volts) may have significantly lower resistance or lower differential resistance at higher voltages.

The present invention achieves low resistance and low differential resistance near the origin of the current-voltage characteristic for a metal—interface layer—semiconductor junction. Generally, the voltage around the origin should be less than about 100 mV, or more preferably less than about 10 mV for purposes of measuring, determining, or utilizing such junctions of low resistance. At higher voltages, the junction resistance will be even lower. It is thus a feature of the present invention to set an upper bound on the resistance of a contact, where the upper bound occurs at low voltages.

It is further noted that in junctions where the Schottky barrier is minimized as described above, such that the Fermi level at the junction interface at zero volts lies at or near the conduction band edge or valence band edge (for n- and p-type semiconductors, respectively), the IV characteristic will be nearly symmetric, especially at low voltage. In this case, the term "forward bias" is not defined in the usual sense of a diode wherein forward bias corresponds to the direction of bias for which greater current flows. Thus, in determining or utilizing low resistance junctions of the present invention, the voltage may be either positive or negative.

It is also possible (in accordance with a further embodiment of the present invention) to make junctions where the Schottky barrier is higher than it would be if the Fermi level at the junction interface were pinned, usually around midgap of the semiconductor. Such junctions are formed in the present invention between a metal with a workfunction near or substantially equal to the conduction band edge of a p-type semiconductor, or between a metal with a workfunction near or substantially equal to the valence band edge of an n-type semiconductor. These junctions are diodes, in that little current will flow if the n-type (p-type) semiconductor is biased positive (negative) with respect to the metal, and large currents will flow if the voltage is reversed. The low-current flow state is referred to as reverse bias, and the high-current flow state is referred to as positive bias.

Low resistance in the case of a diode is only relevant in forward bias conditions. In junctions created in accordance with the present invention the resistance contribution of the interface layer is smaller than the resistance due to the Schottky barrier. That is, in forward bias conditions for junctions created in accordance with the present invention, the transport of charge is limited mainly by the thermal emission of carriers from the semiconductor over the barrier at the interface, and not by the tunneling through the interface dielectric. Thus, tow resistance in the case of a diode refers to a resistance lower than the resistance presented by the Schottky barrier.

In certain applications of diodes, the ability to withstand high reverse biases may be more desirable than high current flow in forward bias. These applications would be considered high voltage/low power applications. In such cases, a low resistance is not essential, and junctions created in accordance with still another embodiment of the present invention provide high-voltage diodes capable of withstanding voltages higher than could otherwise be achieved if the Fermi level of the semiconductor in the junction were pinned.

The present invention is discussed below in terms of presently preferred embodiments thereof, however, this discussion is not meant to limit the scope of the invention. By studying the present disclosure, others of ordinary skill in the art may recognize equivalent procedures, materials or structures that can be substituted for those described herein to achieve the same effect. The reader is advised and reminded that the use of such equivalents is deemed to be within the scope of the present invention. For example, where tile discussion refers to well-known structures and devices, block diagrams are used, in part to demonstrate the broad applicability of the present invention to a wide range of such structures and devices.

I. Introduction and Definitions

Figure 2:
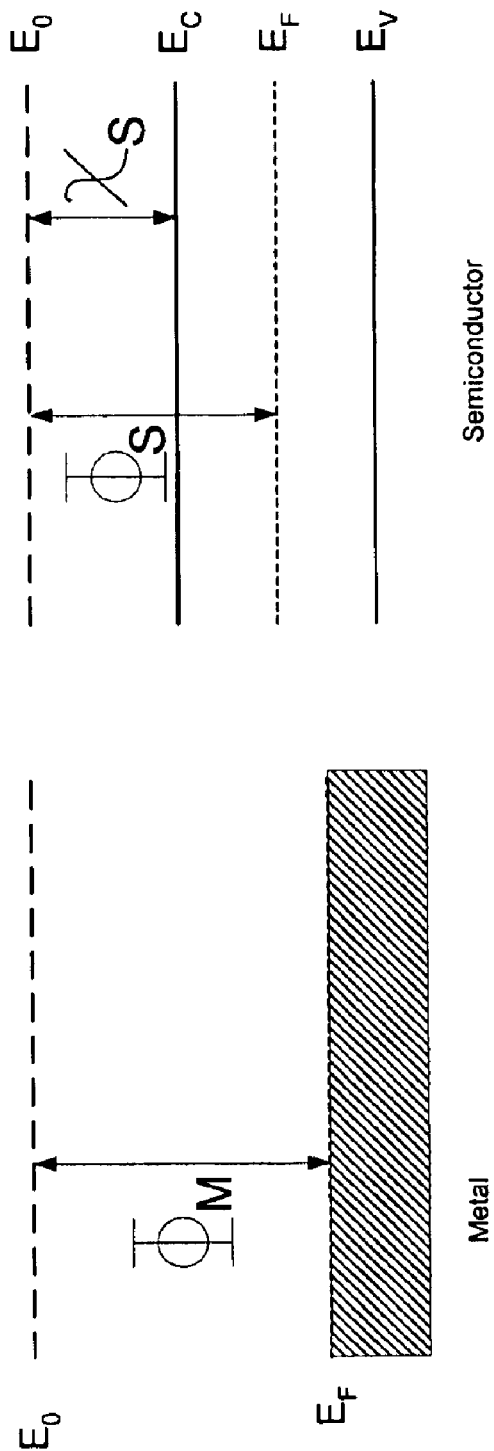
FIG. 2 illustrates various energy levels for metals and semiconductors and is labeled to show the work function of a metal and the electron affinity of a semiconductor.

The present discussion makes use of terms that, although well known in the art, may not be familiar to all readers. Therefore, before beginning a detailed discussion of the present invention, it is helpful to define certain terms and concepts. To understand the properties of metal-semiconductor junctions and the impact of the present invention, one must refer to some important energy scales, which are shown graphically in FIG. 2. The so-called vacuum level ($E_O$) represents the minimum energy that an electron needs to possess in order to completely free itself from a metal or semiconductor. For a metal, the Fermi level ($E_F$) represents the highest occupied energy level for the material. That is, nearly all energy states below the Fermi level are filled, while nearly all states above the Fermi level are empty. The work function of the metal ($\Phi_M$) is then defined as the energy required to free an electron at the Fermi level and mathematically it is the difference between the vacuum level and the Fermi level. The work function is an invariant bulk property of the metal.

As illustrated in the diagram, semiconductors also have a Fermi level ($E_F$) and a work function ($\Phi_S$), however, the work function is not an invariant property of the semiconductor. Because the Fermi level varies depending on the doping level in the semiconductor (i.e., the relative amounts of impurities introduced into the semiconductor crystal which change the electron and hole carrier concentrations), a separate parameter, the electron affinity ($X_S$), is defined. The electron affinity is an invariant property of the semiconductor and is the difference between the vacuum level and the conduction band edge of the semiconductor. In a semiconductor, almost all energy states are filled in the valence band ($E_V$) while the conduction band ($E_C$) is almost empty.

Figure 3:
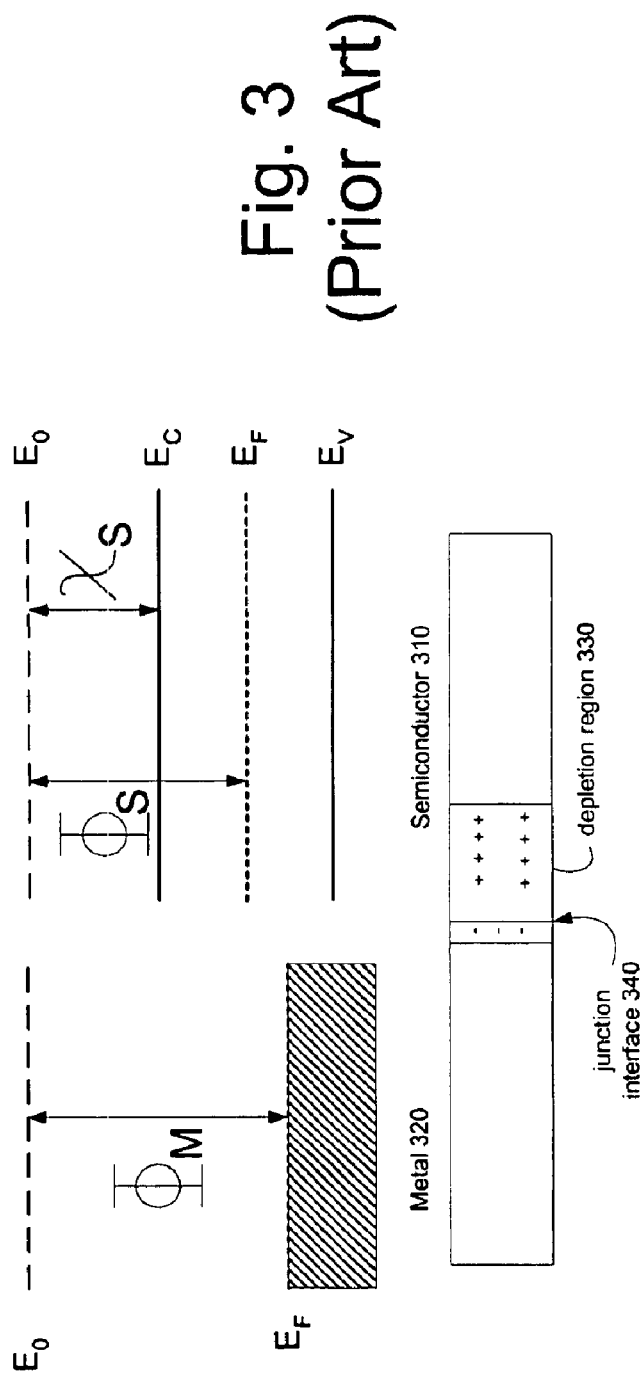
FIG. 3 shows an energy band diagram for a conventional metal—n-type semiconductor junction and also illustrates the concept of a depletion region formed in the semiconductor when the materials are brought into contact with one another.

Now consider a conventional junction between a metal and an n-type semiconductor that has a work function smaller than the work function of the metal (i.e., $\Phi_S<\Phi_M$). An n-type semiconductor is one in which electrons are the majority charge carriers (in p-type semiconductors, holes are the majority charge carrier). As shown in FIG. 3, because the Fermi level in the semiconductor is higher than the Fermi level in the metal, electrons transfer from the semiconductor 310 to the metal 320 when the materials are brought into contact. Thus, a depletion region (i.e., a region in which there are no free charge carriers) 330 forms near the junction interface 340.

Figure 4:
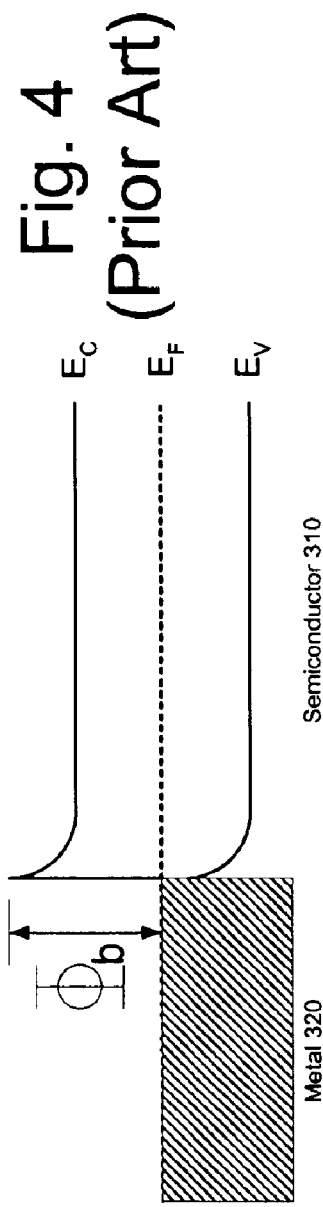
FIG. 4 illustrates band bending at a conventional metal—n-type semiconductor junction.

The formation of the depletion region gives rise to an electric field and so-called "band bending", as one approaches the junction interface from the semiconductor side (see FIG. 4). The band bending creates an energy barrier (discussed above) that blocks further transfer of electrons into or out of the semiconductor. Similar barriers are formed for a junction between a metal and a p-type semiconductor when the work function of the metal is less than the work function of the semiconductor. However, in the case of a metal—n-type semiconductor junction in which the work function of the semiconductor is greater than that of the metal or a metal—p-type semiconductor junction in which the: work function of the semiconductor is less than that of the metal, no such energy barriers are created and the contact is said to be ohmic in nature.

As discussed above, although Schottky first postulated that the height of the energy barrier ($\Phi_b$) formed at a metal-semiconductor junction was simply the difference between the work function of the metal and the electron affinity of the semiconductor, experiments have not verified this relationship. Instead a more complex explanation that takes into account the effects of surface defect states, inhomogeneities and MIGS appears to provide more accurate estimates of barrier heights by explaining the pinning of the Fermi level in the semiconductor. The present inventors have created a technique which is believed to depin the Fermi level of a Si-based semiconductor at a junction with a metal (and thus allow for control or tuning of the barrier height) by both passivating the semiconductor surface (to eliminate or at least reduce the effects of surface states and possibly inhomogeneities) and displacing the metal from the semiconductor (to eliminate or at least reduce the effects of MIGS). This depinning is achieved by introducing an interface layer between the semiconductor and the metal to create a semiconductor—interface layer—metal junction, which still permits significant current to flow between the metal and the semiconductor when the junction is forward biased.

This latter point is important. As discussed further below, for contacts where the energy bands of the semiconductor and the conductor align (i.e., where the Fermi level of the conductor aligns with the conduction or valence band of the semiconductor depending on semiconductor type and/or contact application), if the interface layer is too thin, the specific contact resistance of the junction increases because of the presence of MIGS, resulting in an increased barrier height; thus, current flow is hampered. Conversely, if the interface layer is too thick, the specific contact resistance is again increased and one gets low current across the junction because of tunneling limitations. The present invention achieves an interface layer that is thick enough to reduce or eliminate the effect of MIGS, while still thin enough to permit significant current flow.

II. Passivation of Semiconductor Surfaces

A common processing operation performed during semiconductor device fabrication is silicon surface passivation. Surface passivation (whether by an oxide or another material) chemically neutralizes and physically protects the underlying silicon. For example, exposing a silicon surface to oxygen (under the appropriate conditions to grow a protective film of silicon dioxide) will allow the oxygen to react with the dangling bonds of the silicon surface to form covalent bonds that satisfy the surface silicon atoms' valency and render the surface fully coordinated. These covalent bonds provide chemical stability to the silicon surface. The covalent bonds also tie up unbound charges that exist on the silicon surface as a result of the discontinuation of the semiconductor crystal at the surface.

However, passivation with silicon dioxide has several significant disadvantages. For example, silicon dioxide is a dielectric insulator that poses a significant barrier to the flow of current. Accordingly, a layer of silicon dioxide deposited or grown on a silicon surface may significantly reduce the ability for electrical current to flow through that surface. As a result, the use of silicon dioxide has been limited in practicality to surfaces external to the active region of semiconductor devices through which current passes during device operation (e.g., as a gate oxide layer). This disadvantage is compounded by the fact that the silicon dioxide grows very rapidly and readily on the silicon surface so that it is difficult to limit the growth to a thin layer. Silicon dioxide is also a poor diffusion barrier to semiconductor dopants such as boron.

Instead of making use of silicon dioxide then, in one embodiment the present inventors utilize a nitrided semiconductor surface to provide chemical passivation. That is, a nitride layer is introduced to passivate the semiconductor surface by eliminating or at least reducing the effects of surface states and possibly inhomogeneities. The nitride layer also displaces the metal from the semiconductor and eliminates or at least reduces the effects of MIGS. The result of introducing the nitride layer as an interface between the semiconductor and the metal is a depinning of the Fermi level of the semiconductor. When the Fermi level of the semiconductor is depinned, the Fermi level of the metal at the interface will be that of the bulk metal, and will not be dependent upon the interface. In addition to the above, the present inventors propose techniques for providing non-insulating, passivated semiconductor surfaces using materials other than nitrogen; for example, oxides, hydrides, arsenides and/or fluorides.

These developments have wide applicability in connection with the fabrication of Schottky diodes, Schottky-barrier transistors and other electrical components. For example, in Schottky diodes, the ability to control the energy barrier height at the diode junction is important if the device is to be tailored to specific applications. Use of the present techniques allows for tuning of the barrier height. Further, for other three-terminal devices with Schottky-barrier-isolated channels, control of device characteristics is made possible through the present invention by allowing n- and p-type devices to be fabricated without dopants, relying instead on the use of metals with different work functions.

Figure 5:
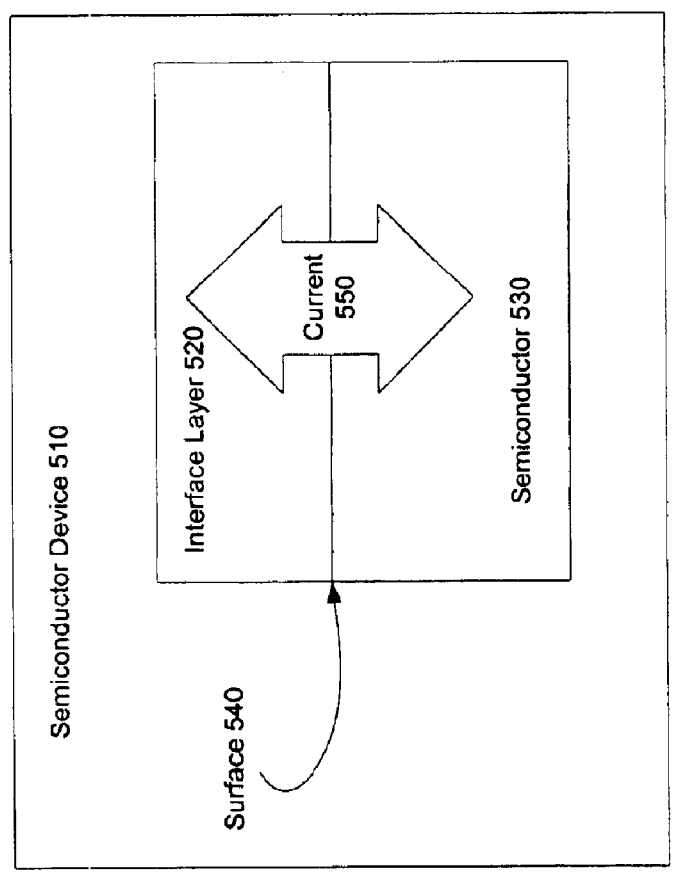
FIG. 5 shows a semiconductor device containing a semiconductor material having a surface across which electrical current flows during operation of the semiconductor device, and containing an interface layer formed on the surface according to one embodiment of the present invention.

FIG. 5 shows a semiconductor device 510 that contains a semiconductor 530 and an interface layer 520 formed on a surface 540 of the semiconductor in accordance with the present invention. The terms semiconductor device, microelectronic device, monolithic device, chip, and integrated circuit are often used interchangeably in this field. Any or all such devices may each contain an interface layer formed on a semiconductor surface in accordance with the present invention.

The semiconductor 530 contains a semiconductor material. The term semiconductor material refers to a material having a bandgap that is greater than about 0.1 eV and less than about 4 eV. The term bandgap refers to an energy gap of forbidden energy levels separating the conduction band, which is an upper energy band that is mostly devoid of electrons and wherein electrons can conduct, and the valence band, which is an energy band that is mostly filled with electrons and wherein electrons cannot conduct. The semiconductor material may have a wide range of doping levels including no doping at all.

The semiconductor 530 has a surface 540 that is passivated by the interface layer 520. In this context (and as used elsewhere herein) the term passivation means the elimination or at least the reduction of the effects of surface states due to defects or dangling bonds of the semiconductor surface 540. Note that passivation does not, as a practical matter, require that all surface states be eliminated. Rather, it is the effect of surface states on the device properties that is limited or eliminated in passivation. Note further that the presence of MIGS may be regarded as a surface state, however, as used herein the term passivation is not meant to infer the elimination of MIGS (though in some cases, a passivation layer may have sufficient thickness to provide a separation layer between the semiconductor and the metal sufficient to reduce or eliminate MIGS). The semiconductor 530 is operable to be electrically coupled with a first voltage associated with the semiconductor device 510 and to conduct electrical current 550 across the passivated surface 540.

The interface layer 520 is formed on the semiconductor 530 and may contain a passivation material that bonds to the semiconductor material by way of a covalent (or other) bond formed between the passivation material and the semiconductor material. For example, an atom of passivation material may covalently bond with a dangling bond of a surface silicon atom to fully coordinate the silicon atom and thereby help passivate the silicon atom. In some cases, the passivation material may be the sole component of the interface layer 520, while in other cases the interface layer 520 may be a compound layer that includes both a passivation layer and a separation layer. That is, the interface layer serves to (i) chemically passivate the semiconductor surface 540, and (ii) displace the semiconductor from the metal sufficiently to eliminate or at least reduce the effect of MIGS. As explained below, this may necessitate including a separation layer in addition to a passivation layer within the interface layer, depending on the passivation material selected. Of course, the combination of the passivation layer and the separation layer must be sufficiently thin to permit the low specific contact resistances described herein.

Different passivation materials are contemplated. According to one embodiment, the interface layer 520 is formed using a material that is preferably selected from the group consisting of hydrogen (H), oxygen (O), nitrogen (N), arsenic (As), and fluorine (F) (that is, the interface layer 520 may include a nitride, an oxide, a hydride, an arsenide and/or a fluoride). Other materials having chemical characteristics or valences similar to these materials may also be used. Note that distinct separation layers (i.e., in addition to the passivation layer(s)) may be needed where H, As, or F passivation layers are used, as these tend to form monolayer coverage, rather than a layer of a compound with Si of process-dependent thickness. In contrast, passivation layers made using N and/or O may not require distinct separation layers, as these elements may form a layer of a compound of Si with a thickness that can be varied depending on processing.

Different amounts of passivation material are contemplated to be useful for different embodiments of the present invention. Often, the interface layer 520 includes or is made up of a passivation layer with a thickness of between approximately (0.1 nm and about 5 nm. For example, depending upon the particular implementation, the thickness may be less than about 1 nm, less than about 0.5 nm, less than about 0.2 nm, may be the thickness corresponding to a single layer or monolayer of passivation material that is bonded to the semiconductor surface, or may even be the number of atoms of passivation material required to passivate substantially all the dangling bonds associated with the semiconductor surface 540.

In some cases, passivation of the semiconductor surface 540 will include removing (or terminating) dangling bonds located proximate to the surface of the semiconductor material, including those at the surface as well as those within a few molecular dimensions from the surface. This process may stabilize the surface of the semiconductor material and may improve the controllability of subsequent fabrication operations. Passivation may also reduce the density of surface states that may exist at the semiconductor surface as a result of the discontinuation of the semiconductor crystal at the surface. This may improve consistency and performance of the semiconductor device, inasmuch as such states are known to interfere with proper device operation. For example, they may provide surface charge states that result in a pinning of the Fermi level.

III. Forming Interface Layers

Exemplary methods for forming interface layers to provide (i) passivation of semiconductor surfaces, and (ii) displacement of the semiconductor from the metal to eliminate or at least reduce of the effects of MIGS within the semiconductor when in the presence of the metal (collectively referred to herein as depinning the Fermi level of the semiconductor) with hydrogen, fluorine or nitrogen are presented below to further illustrate the concepts of the present invention. Other passivation materials may include arsenic, oxygen or an oxynitride, and in some cases such passivation layers are combined with separation layers (e.g., made of an oxide) to complete the interface layer.

A. Hydrogen And Fluorine

An interface layer may contain hydrogen, fluorine, or both hydrogen and fluorine (e.g., in the form of a hydride and/or a fluoride). One method for forming an interface layer on a semiconductor surface with hydrogen and fluorine includes cleaning the semiconductor substrate with a cleaning solution, immersing the cleaned substrate in a hydrogen fluoride solution (or other liquid containing hydrogen and fluorine ions) having an effective concentration typically between about 1%–50% by weight, waiting an effective period of time, typically between about several seconds and about 5 minutes, removing the substrate from the hydrogen fluoride solution, optionally rinsing the substrate in deionized water, and blow-drying the substrate with nitrogen. Such a method may form an interface layer containing hydrogen and fluorine that are bonded (e.g., covalently) to the semiconductor surface.

It should be noted that long rinses in deionized water, generally longer than about 30 seconds, might remove the hydrogen passivation. Thus, deionized water rinses might advantageously be kept to less than about 30 seconds to maintain the hydrogen passivation of the surface. Also, the higher the concentration of the hydrogen fluoride during the immersion, the greater the concentration of fluorine passivation. Finally, methods are also contemplated where the ratio of hydrogen to fluorine passivation is altered by removing either the hydrogen or the fluorine.

An interface layer formed in this fashion may be best suited for applications where a subsequent metal layer is deposited over the interface layer in a generally non-invasive fashion, for example using a thermally evaporated source. Experiments by the present inventors to date suggest that using other approaches (e.g., plasma deposition) may cause damage to the thin (e.g., monolayer thick) interface layer contemplated as part of the present invention.

B. Nitrogen

In a further embodiment, an interface layer may contain nitrogen (e.g., in the form of silicon nitride). One method for forming an interface over a semiconductor surface with nitrogen includes heating a substrate containing the semiconductor surface in the presence of a nitrogenous material (that is, a gas or other material containing nitrogen). For example, a substrate containing an exposed silicon surface may be annealed at a temperature between about 300° C. and about 750° C., which is lower than temperatures conventionally used for Rapid Thermal Nitridation (RTN), under a gaseous ambient having, for example, ammonia ($NH_3$) at some effective partial pressure. By exposed, we mean a clean surface, free of everything except silicon. Such a method may form an interface layer containing nitrogen, often in the form of a nitride, bonded to the semiconductor surface. Note that the present inventors have observed indications suggesting that in these low temperature conditions interface layer growth is self-limiting, depending only on temperature.

According to another embodiment, an interface layer that includes nitrogen may be formed on an exposed surface of a semiconductor material by a method that includes heating a semiconductor material to a substantially high temperature under vacuum and exposing the semiconductor material to a substantially small amount of a nitrogenous material, such as ammonia. The method may include placing a semiconductor having an exposed semiconductor surface in a heating chamber, pulling a vacuum of less than about one millionth of a Torr, or more favorably an ultra high vacuum of less than $10^9$ Torr, and then heating the semiconductor in the heating chamber to a substantially high temperature. The higher the vacuum, the longer the substrate may be heated without growth of an oxide from residual oxygen or water in the chamber. Thus, the process may include heating the semiconductor to a temperature that is between about 900° C. and about 1000° C., or higher, in an inert ambient. As desired, the semiconductor may be exposed to hydrogen gas, or an equivalent, to reduce any native oxide on the semiconductor. These high temperatures may provide for greater passivation of the semiconductor surface as compared with results that may be achieved at lower temperatures.

Then, the heated semiconductor may be exposed to a substantially small amount of a nitrogenous material, such as ammonia. This may include exposing the semiconductor surface to ammonia for a substantially short period of time. For example, the surface may be subjected to a burst or pulse of ammonia lasting for a time period between about 0.5 seconds and about 5 seconds. Alternatively, the surface may be exposed to a controlled, small amount of ammonia over an arbitrarily longer period of time. In this way, the substantially small amount of ammonia will react with the surface to form a nitrogenous interface layer, such as a nitride layer, thereon and then further growth of the interface layer will cease. Then the semiconductor may be cooled from the substantially high temperature to ambient temperature and removed from the heating chamber. Further annealing of the substrate and the grown nitride layer may also be performed in the vacuum chamber before removal, at a substantially elevated temperature between about 700° C. and 1000° C., or higher.

Advantageously, it has been unexpectedly observed that a process such as that described above and incorporating substantially high temperature exposure for substantially short periods may be used to controllably form thin yet effective interface layers. That is, the present inventors have observed that in the creation of thin interface layers that include nitrogenous materials, temperature appears to be a dominant factor in controlling thickness. For example, by such methods effective interface layers may be formed having a thickness that is less than about 1 nm, less than about 0.5 nm, less than about 0.2 nm, or having a thickness that corresponds to essentially a single monolayer sufficient to passivate essentially all dangling bonds proximate the semiconductor surface.

Further, thin interface layers may be advantageously grown on a semiconductor in the presence of nitrogen gas, or other inert nitrogen-containing gas. The reaction rate of a semiconductor such as silicon with nitrogen gas is significantly lower than that of a reactive nitrogen-containing gas such as ammonia. The slow growth rate may be desirable for better control of the growth of films of nitrogen on a semiconductor of a thickness of less than about 1 nm, less than about 0.5 nm, less than about 0.2 nm, or having a thickness that corresponds to essentially a single monolayer sufficient to passivate essentially all dangling bonds proximate the silicon surface.

IV. Diodes Containing Passivated Semiconductor Surfaces

Diodes made from Schottky barriers (i.e., asymmetric electrical potentials formed at a junction between a metal and a semiconductor) are widely used in rectifiers in power supply and control applications. As used herein, the terms Schottky diode, metal-semiconductor junction diode, diode, and rectifier are all related and appear in order from more specific at the left to more general at the right. Likewise, the terms Schottky barrier, metal-semiconductor barrier, conductor-semiconductor junction, and multi-material junction are all related and appear in order from more specific at the left to more general at the right. The term Schottky diode will be used to refer to a diode containing a Schottky barrier.

As mentioned above, the present inventors have devised a scheme to control or adjust a Schottky barrier height by forming an interface layer (which includes or sometimes consists of a passivation layer that includes an oxide, oxynitride, nitride, arsenide, hydride, fluoride, or an equivalent) between a metal and a semiconductor. This scheme differs from past attempts by others to control barrier height, which attempts generally involved either using a silicide as a contact metal (and thus limiting the choices of available contact metals to those that can form suicides), or using esoteric substrates that exhibit wide bandgaps. Further, in previous devices the Fermi level of the semiconductor remains pinned, with the barrier height being virtually independent of the metal used. Finally, doping of substrates has also been attempted, however, it has not been shown to truly affect the barrier height of the substrate material. For example, PtSi contacts have reduced resistance due to high silicon doping such that the current across the junction is dominated by tunneling through the barrier. Doping may thus lead to cases where the top of the barrier may be so thin as to be essentially transparent to electrons, however, doping does not appear to allow actual tuning of the barrier height.

Figure 6:
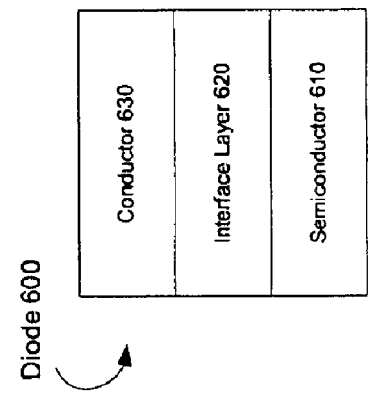
FIG. 6 shows an electrical junction containing an interface layer that is disposed between a semiconductor and a conductor in accordance with one embodiment of the present invention.

FIG. 6 shows an example of a diode 600 containing, according to one embodiment of the present invention, an interface layer 620 disposed between and attached to both a semiconductor 610 and a conductor 630. The conductor and the semiconductor are operable to be electrically coupled with different voltages associated with the operation of the diode 600 and to pass electrical current through a passivated semiconductor surface formed at the junction between the semiconductor 610 and the interface layer 620.

The conductor 630 contains a conductive material such as a metal or an alloy of a metal. The terms metal, conductive material, and conductor are all related and appear in order from specific at the left to general at the right. In general, the terms refer to a highly electrically conductive substance that has a Fermi energy level that sits in a partially filled band. Unless otherwise specified, conductors include metals (e.g., pure metals and alloys), and other conductors such as doped polysilicon (a nonporous silicon containing randomly oriented crystallites), doped single crystal silicon, and metal silicides. Note that alloys may have workfunctions different than their constituents and may be designed to have specific workfunctions though selective use of ratios of the constituent metals.

Often, the conductor is a metal since metals may offer advantages over conductive semiconductors including lower resistance, higher carrier mobilities that provide superior high frequency performance and switching, favorable low power characteristics, and ease of manufacturing control. Use of metals may also avoid the need to perform semiconductor doping, which may simplify manufacturing and improve quality control.

Metals that are contemplated include pure metals, alloys, refractory metals, metals that do not form silicides, metals physically deposited by substantially non-invasive processes such as by condensation of a thermally evaporated metal vapor, and metals having a predetermined work function. The use of non-invasively deposited metals may allow for forming the metal on a thin interface layer without disrupting the passivation properties of the layer.

A metal having a predetermined work function may be a metal having a work function smaller or greater than that of the semiconductor, depending on the desired application. Often, the semiconductor will be silicon. In this case by the work function of a semiconductor or silicon we mean the energy in the middle of the semiconductor bandgap. Exemplary metals that have a work function smaller than silicon include Group 3A elements, aluminum (Al), indium (In), titanium (Ti), chromium (Cr), tantalum (Ta), cesium (Cs), magnesium (Mg), erbium (Er), ytterbium (Yb), manganese (Mn), lead (Pb), silver (Ag), yttrium (Y), and zinc (Zn). Exemplary metals that have a work function greater than silicon include platinum (Pt), gold (Au), tungsten (W), nickel (Ni), molybdenum (Mo), copper (Cu), cobalt (Co), and palladium (Pd).

The semiconductor-interface layer-conductor configuration illustrated in FIG. 6 defines what the present inventors have chosen to call a "passivated Schottky barrier". The passivated Schottky barrier is a naturally formed electrical potential barrier to an electron or hole at the Fermi energy (the electrochemical potential) in the conductor due to a depletion region formed in the semiconductor adjacent the conductor. The passivated Schottky barrier may deviate in barrier height from a standard un-passivated Schottky barrier that would form naturally at a contact junction between the semiconductor and the conductor without the interface layer disposed therebetween. That is, the passivated Schottky barrier may have a barrier height that depends predominantly upon the bulk characteristics of the semiconductor and the conductor, rather than on surface properties, and may depend in part on the characteristics of the interface layer.

Indeed, the present inventors have determined that changes in barrier height are approximately monotonic and continuous for variations in surface passivation thickness by nitridation of the semiconductor substrate. More specifically, experiments by the present inventors in a regime where the nitride layer is sufficiently thick to remove MIGS show that temperature of interface layer formation has the strongest effect on barrier height. In other regimes, thickness may be critical. Ideally, if all surface states are removed, barrier height should be controllable simply by the choice of metal used.

Figure 8:
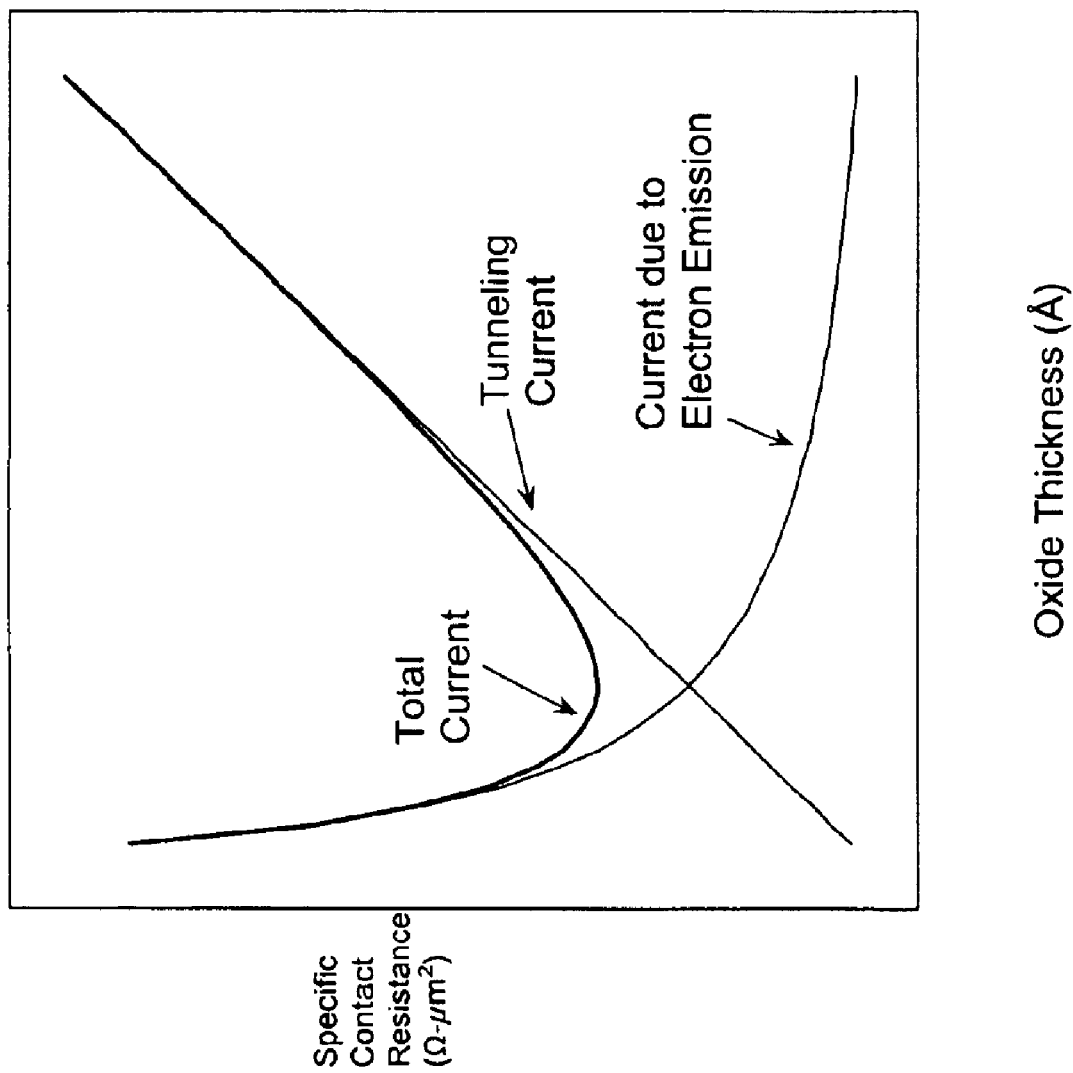
FIG. 8 shows a curve of interface layer resistance versus interface layer thickness for an electrical junction containing an interface layer disposed between a semiconductor and a conductor in accordance with one embodiment of the present invention.

To understand why thickness of the interface layer is important, refer briefly to FIG. 8 where a graph of interface-specific contact resistance versus interface thickness is shown. The graph is for a structure where the workfunction of the metal is the same as the electron affinity in the semiconductor, such that the Fermi level of the metal lines up with the conduction band of the semiconductor. At large thicknesses, the interface layer poses significant resistance to current. As thickness decreases, resistance falls due to increased tunneling current. However, there comes a point where even as the interface layer continues to get thinner, resistance increases. This is due to the effect of MIGS, which increasingly pull the Fermi level of the metal down towards mid-gap of the semiconductor, creating a Schottky barrier. The present inventors have discovered that this competition results in an optimum thickness, as shown in the illustration, where the resistance is a minimum. At this thickness the effect of MIGS has been sufficiently reduced to depin the metal and lower the Schottky barrier, and the layer is still sufficiently thin to allow significant current flow across the interface layer. Contact resistances of less than or equal to approximately 2500 $\Omega$-$\mu m^2$, 1000 $\Omega$-$\mu m^2$, 100 -$\mu m^2$, 50$\Omega$-$\mu m^2$, 10 $\Omega$-$\mu m^2$ or even less than or equal to 1 $\Omega$-$\mu m^2$ may be achieved.

Characteristics that may be adjusted to provide a desired barrier height thus include the passivation material used (e.g., selection based on bandgap), the interface layer thickness (e.g., especially where the interface layer is a compound layer formed of a passivation layer and a separation layer), the method of forming the interface layer (e.g., control of parameters such as temperature), the interface layer thickness that is substantially similar to a penetration depth of MIGS formed at a metal interface, the metal used for the source and/or drain, and other characteristics.

One advantage of the ability to adjust the Schottky barrier height with the introduction of interface layer 620 is the ability to form a substantially high barrier height. For example, an interface layer may be used to create a Schottky barrier having a barrier height that is greater than can be achieved through the use of metal suicides, greater than about 2.0 eV, or greater than about 2.5 eV (using a semiconductor with a bandgap at least this large), or nearly 1.0 V using silicon. Such high barrier heights imply the ability to withstand high voltages before breakdown occurs. Thus, Schottky barriers having such high barrier heights may be particularly useful in high-voltage Schottky diodes.

Another advantage achieved through the use of the interface layer 620 is greater flexibility afforded in selecting a conductor 630. Typically, metals chosen for application in classic Schottky diodes are those that can form a silicide with a silicon semiconductor. The formation of the silicide helps to reduce surface states (resulting, from dangling bonds), but not the effects of MIGS. Thus, the Fermi level at the semiconductor surface is still pinned. Using metals that form silicides upon contact with silicon may thus help to make the devices more reproducible in a manufacturing environment, but such devices still suffer from the drawback of having a barrier height that is fixed.

According to one embodiment of the present invention, however, one may select a conductor that is not able (or not readily able) to form a silicide with the semiconductor. The metal silicide is not needed because the interface layer provided in accordance with the present invention passivates the semiconductor surface and also reduces or eliminates the effect of MIGS. This may allow for selection of a metal that has properties such as a desirable work function or Fermi level energy, even though that metal may not form a metal silicide.

For example, to make large-barrier diodes, for an n-type doped silicon semiconductor, a metal may be selected that has a work function that is either substantially equal to the valence band energy of the semiconductor or that is within about 0.1 eV to about 0.3 eV of the valence band energy of the semiconductor. Similarly, for a p-type doped silicon semiconductor, a metal may be selected that has a work function substantially equal to the conduction band energy of the semiconductor. For Schottky diodes configured in accordance with the present invention, the Fermi level of the metal may lie anywhere in the bandgap of the semiconductor when an interface layer is disposed within the junction, resulting in diodes of various barrier heights. The Fermi level of the metal may also lie in the conduction or valence band of the semiconductor.

The use of interface layer 620 thus provides a way to tune, adjust, or control the height of the barrier between the conductor and the semiconductor. Without the interface layer 620, the barrier height would be substantially un-tunable, un-adjustable, and fixed (as discussed above).

The role played by interface layer 620 in tuning, adjusting, or controlling the height of the barrier between the conductor 630 and the semiconductor 610 may be understood as a depinning of the Fermi level of the semiconductor. That is, the interface layer may reduce surface states by bonding to the semiconductor material to consume dangling bonds. Additionally, the interface layer may reduce the formation of MIGS in the semiconductor by providing a thickness and bandgap that prevent the electron wave function (of the metal) from penetrating into the semiconductor. The electron wave function ray instead penetrate into the interface layer and form MIGS within the interface layer at an energy related to the states of the interface layer material. As desired, the density of the MIGS and the depth of MIGS penetration into the interface layer may be reduced by choosing an interface layer material or materials having a larger bandgap or higher effective mass than the semiconductor.

According to one embodiment of the present invention then, the interface layer 620 is incorporated into a device operable to pass current through the semiconductor surface and the interface layer during device operation. In such an embodiment, it may be desirable to use an interface layer having a thickness of a monolayer, or, for example between about 0.1 nm and about 0.3 nm, and also having a wide bandgap (as compared to that of the semiconductor) so that the interface layer both de-pins the Fermi level (so that the barrier height depends predominantly on bulk properties of the junction materials) and allows sufficient current transfer across it. Advantageously, such interface layers may be sufficiently thin to provide low impedance to current flow (due to the exponential dependence of direct tunneling on barrier thickness), which is desirable for many semiconductor devices, while also providing sufficient semiconductor surface passivation to allow an adjustable barrier height. That is, the interface layer may allow passivation of surface states and reduction (or elimination) of MIGS in the semiconductor to allow for an adjustable barrier height with a substantially thin layer that allows sufficient current to be transferred across the interface layer.

There are several methods by which the barrier height can be made adjustable. For example, adjustment may be made by tuning the degree of Fermi level pinning. In other words, some embodiments may allow for a sufficiently thin interface layer so that not all of the effects of MIGS in the Si are eliminated. Further, the pinning may be varied by combinations of thickness of the interface layer and the choice of interface material. The metal in contact with the interface layer may be pinned by MIGS at different levels in different materials. Conversely, or in addition, the passivation may be left incomplete to allow for an effective level of unpassivated states. Complete depinning of the Fermi level (that is removal of all surface states in Si including MIGS) is another option, in which case one could tune the barrier height simply by choosing a pure metal or an alloy that possesses the desired workfunction. In that case, the barrier height is determined by Equation (1), which until now has been an unrealizable idealization. Note that the type of tuning being discussed here is adjustment of the barrier height by altering the structure of the junction at the time of manufacture, not by varying an externally applied condition during junction operation.

Figure 7B:
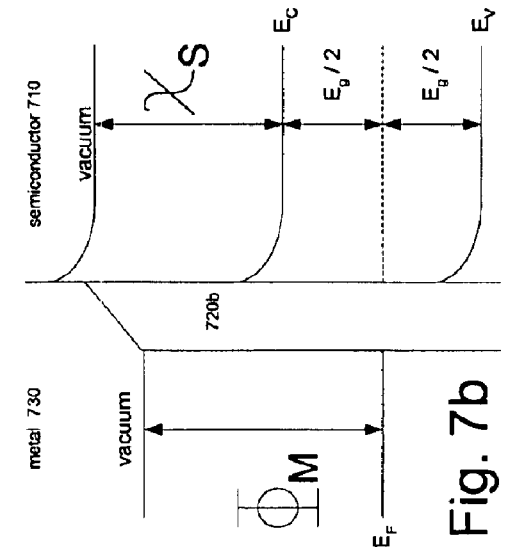
FIGS. 7a, 7b, 7c and 7d show relationships between Fermi energy, conduction-band energy, and valence-band energy for an unpassivated Schottky diode, a passivated Schottky diode in which MIGS are not removed, an unpassivaled Schottky diode in which MIGS are removed and a passivated Schottky diode in which MIGS are removed according to one embodiment of the present invention, respectively.
Figure 7D:
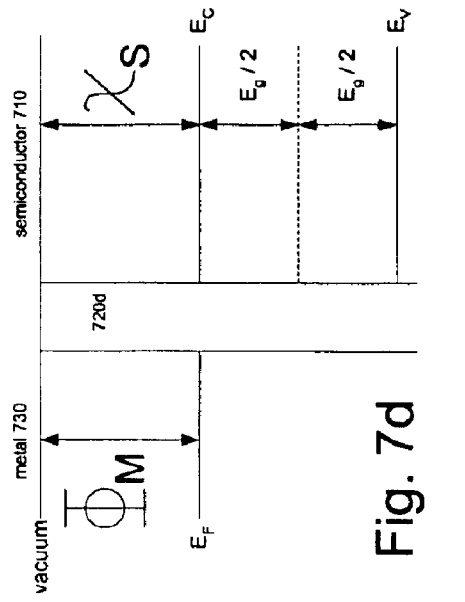
Figure 7A:
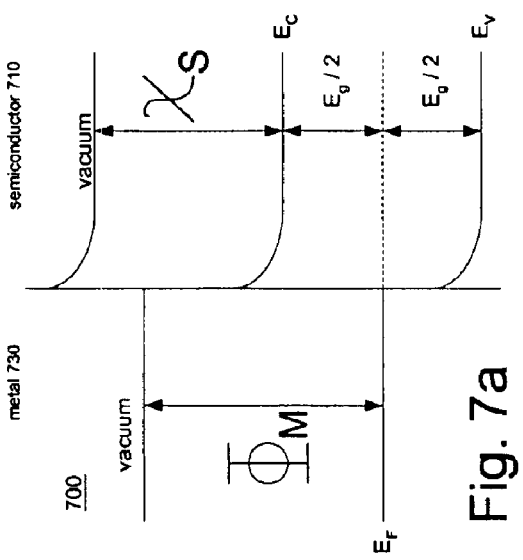
Figure 7C:
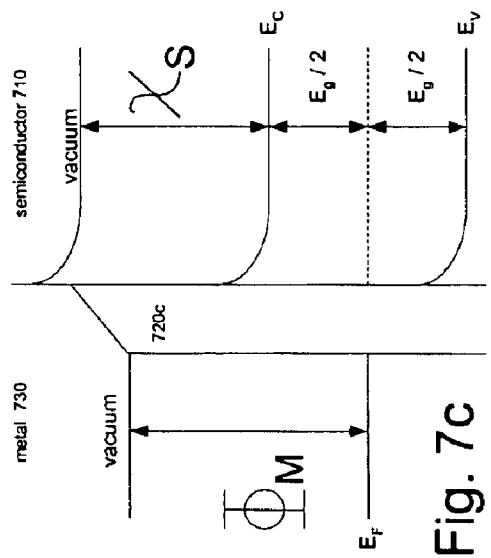

FIGS. 7a–7d show relationships between Fermi energy, conduction band energy, and valence band energy for various Schottky barriers containing a metal in contact with (or in close proximity to) a semiconductor, where the bandgap ($E_g$) of the semiconductor exists between the conduction band ($E_c$) and the valence band ($E_v$). In this example, the work function of the metal $\Phi_M$ is chosen to be approximately equal to the electron affinity $X_S$ of the semiconductor. In FIG. 7a, an unpassivated Schottky barrier 700 is shown. In this example, the Fermi level ($E_F$) of the metal 730 is pinned in the bandgap of the semiconductor 710. This results in a discontinuity in the vacuum level caused by a charged dipole at the interface.

In FIG. 7b, the interface layer 720b is thick enough to passivate dangling bonds at the surface of the semiconductor 710, but not thick enough to eliminate or sufficiently reduce the effect of MIGS. As a result, the band structure is largely unaltered from that seen in the previous illustration. Similarly, in FIG. 7c, when the interface layer 720c is sufficiently thick to eliminate or reduce the effect of MIGS but not to passivate the semiconductor surface, little change in the energy band structure is observed. However, as shown in FIG. 7d, when the interface layer 720d is sufficient to both eliminate or reduce the effect of MIGS and to passivate the semiconductor surface, we see the Fermi level of the metal aligning with the conduction band of the semiconductor (i.e., the Fermi level of the semiconductor has been depinned and no longer lines up with the Fermi level of the metal). The vacuum level is now continuous as there is no charged dipole at the interface. Thus, the band structure of a device constructed in this fashion is a result of only bulk material properties, not properties of the surface. By way of example, the materials in such cases nay be Al and Si, with a work function for Al of approximately $\Phi_M$=4.1 eV and the electron affinity for Si of approximately $X_S$=4.05 eV.

V. Transistors Containing Passivated Semiconductor Surfaces

The interface layers described herein may be used in connection with a semiconductor surface of a channel in a field effect transistor. That is, an interface layer may be disposed between a source and a channel, a channel and a drain, or both of an insulated gate field effect transistor. Such use of an interface layer is described in detail in co-pending U.S. patent application No.: 10/342,576 entitled "INSULATED GATE FIELD EFFECT TRANSISTOR HAVING PASSIVATED SCHOTTKY BARRIERS TO THE CHANNEL", filed Jan. 14, 2003 by the present inventors, and assigned to the assignee of the present invention.

The source and drain contacts at the channel of a field effect transistor are examples of a broader category of metal-interface layer-semiconductor contacts that make up the present invention. In the past, such contacts generally comprised a silicide-n$^+$-Si junction, which formed a somewhat "leaky" Schottky diode, with a Fermi level of the semiconductor pinned at the midgap. In contrast, the present invention provides a contact wherein the Fermi level of the metal is aligned with the conduction band of the semiconductor (e.g., as shown in FIG. 7d). Note that in other cases, depending on the type of semiconductor material and conductors used, the Fermi level of the metal may align with the valence band of the semiconductor.

Although both types of junctions (i.e., the new passivated Schottky barrier junction and the conventional silicide-semiconductor junction) permit tunneling currents, the present junction can be fabricated with a much thinner interface layer as compared to the thickness of the silicide layer used previously. Indeed, thickness of an order of magnitude less than the silicide thickness can be expected. In a conventional silicide—semiconductor junction a Schottky barrier is formed which is comprised of a depletion layer. The tunnel barrier presented by such a depletion layer may be an order of magnitude thicker than the dielectric tunnel barrier in the present invention. The thinner interface layers provided by the present invention permit higher current across the junction (i.e., lower junction specific contact resistance).

Two other properties of the dielectric deserve mention. First is the property of the height of the barrier compared to the semiconductor conduction band (for electrons). In making the barrier thinner than a silicide barrier, the tradeoff may be a higher tunnel barrier (e.g., 2 eV for nitride, compared with about half the gap of 0.6 eV for silicide). Spacer layers may be used with lower barriers (e.g., TiO$_2$ has a barrier of less than 1 eV). Nevertheless, even with the higher barrier to electrons, the present inventors have determined that the resistance can still be one hundred times lower than a contact to silicon with a silicide barrier.

The second property is the effective mass of electrons in the dielectric. Larger mass electrons will not penetrate as far (i.e., because of their shorter wavelength) from the metal into the semiconductor. The less the electrons penetrate into the dielectric, the less the effect of MIGS in the dielectric. Thus, MIGS in the dielectric are reduced with larger bandgap and larger effective mass.

In addition the junction of the present invention can be used in making contacts to source or drain implanted wells and will have the advantage of reducing the need for high doping levels (which are now reaching their limits of solid solubility). The high doping profiles were required in the past in order to keep the junction depletion layer relatively thin, so as to increase the tunneling current, thus reducing the junction resistance. However, it is becoming increasingly difficult to increase doping profiles in order to provide low resistance junctions. It may be possible to reach the same level of resistance with a lower doping concentration using the present invention. It may further be possible to achieve much lower resistance even with lower doping concentration. When the present invention is used with high doping levels, the resistance will be further reduced.

Thus, methods and applications for semiconductor-interface layer-metal junctions have been described. Although described with reference to specific embodiments it should be remembered that various modifications and changes may be made to the techniques described herein without departing from the broader spirit and scope of the invention. The specification and drawings are accordingly to be regarded in an illustrative rather than a restrictive sense and the invention measured only in terms of the claims, which follow.

What is claimed is:

1. An electrical device, comprising:
    a metal;
    a silicon-based semiconductor; and
    an interface layer of less than 1 nm thickness in a vicinity disposed between and in contact with both the metal and the semiconductor and configured to depin a Fermi level of the metal,
    wherein the electrical device has a specific contact resistance of less than or equal to approximately 1000 $\Omega$-$\mu$m$^2$.

2. The electrical device of claim 1 wherein the interface layer includes a passivating material.

3. The electrical device of claim 2 wherein the passivating material comprises one or more of a nitride, a fluoride, an oxide, an oxynitride, a hydride and/or an arsenide of silicon.

4. The electrical device of claim 3 wherein the interface layer consists essentially of a monolayer.

5. The electrical device of claim 2 wherein the interface layer further includes a separation layer.

6. The electrical device of claim 1 wherein the specific contact resistance is less than or equal to approximately 100 $\Omega$-$\mu$m$^2$.

7. The electrical device of claim 1 wherein the specific contact resistance is less than or equal to approximately 50 $\Omega$-$\mu$m$^2$.

8. The electrical device of claim 1 wherein the specific contact resistance is less than or equal to approximately 10 $\Omega$-$\mu$m$^2$.

9. The electrical device of claim 1 wherein the specific contact resistance is less than or equal to approximately 1 $\Omega$-$\mu$m$^2$.

10. The electrical device of claim 1 wherein the interface layer comprises a passivation layer fabricated by heating the semiconductor in the presence of nitrogenous material.

11. The electrical device of claim 10 wherein the nitrogenous material comprises at least one of ammonia (NH$_3$), nitrogen (N$_2$) or unbound nitrogen (N).

12. An electrical device, comprising a metal—interface layer—Si-based semiconductor junction in which the interface layer is less than 1 nm thick in a vicinity of the junction and includes a passivating material and the electrical device has a specific contact resistance of less than approximately 1000 $\Omega\text{-}\mu m^2$.

13. The electrical device of claim 12 wherein the specific contact resistance is less than or equal to approximately 100 $\Omega\text{-}\mu m^2$.

14. The electrical device of claim 12 wherein the specific contact resistance is less than or equal to approximately 50 $\Omega\text{-}\mu m^2$.

15. The electrical device of claim 12 wherein the specific contact resistance is less than or equal to approximately 10 $\Omega\text{-}\mu m^2$.

16. The electrical device of claim 1 wherein the specific contact resistance is less than or equal to approximately 1 $\Omega\text{-}\mu m^2$.

17. The electrical device of claim 12, wherein the passivating material comprises one or more of a nitride, an oxide, an oxynitride a hydride, a fluoride and/or an arsenide of silicon.

18. The electrical device of claim 17, wherein the interface layer comprises a passivation layer and a separation layer.

19. A method, comprising depinning a Fermi level of a conductor in an electrical junction with a silicon-based semiconductor through the use of an interface layer disposed between a surface of the semiconductor and the conductor, wherein the interface layer (i) has a thickness of less than 1 nm in a vicinity of the junction yet sufficient to reduce effects of metal-induced gap states in the semiconductor while providing the junction with a specific contact resistance of less than approximately 1000 $\Omega\text{-}\mu m^2$, and (ii) passivates the surface of the semiconductor.

20. The method of claim 19 wherein the specific contact resistance is less than or equal to approximately 100 $\Omega\text{-}\mu M^2$.

21. The method of claim 19 wherein the specific contact resistance is less than or equal to approximately 50 $\Omega\text{-}\mu m^2$.

22. The method of claim 19 wherein the specific contact resistance is less than or equal to approximately 10 $\Omega\text{-}\mu m^2$.

23. The method of claim 19 wherein the specific contact resistance is less than or equal to approximately 1 $\Omega\text{-}\mu M^2$.

24. The method of claim 19 wherein the interface layer has a thickness sufficient to provide a specific contact resistance of the electrical junction of less than or equal to approximately 1 $\Omega\text{-}\mu m^2$.

25. The method of claim 19 wherein the interface layer includes a passivating material selected from the list comprising: an arsenide, a hydride, a fluoride, an oxide, an oxynitride and a nitride of silicon.

26. The method of claim 25 wherein the interface layer consists essentially of a monolayer.

27. The method of claim 19 wherein the interface layer is grown on the semiconductor surface at temperatures above approximately 300° C.

28. The method of claim 27 wherein the interface layer is grown in the presence of a nitrogenous material.

29. The method of claim 28 wherein the nitrogenous material comprises one of ammonia ($NH_3$), nitrogen ($N_2$), or unbound nitrogen (N).

30. The method of claim 19 wherein the interface layer includes a passivation layer grown by immersion of the semiconductor in a liquid containing hydrogen and fluorine ions.

31. An electrical device, comprising a junction between a Si-based semiconductor and a conductor separated from the semiconductor by an interface layer having a thickness of less than 1 nm in a vicinity of the junction yet that allows a Fermi level of the conductor to align with a conduction band of the semiconductor, wherein the electrical device has a specific contact resistance less than approximately 1000 $\Omega\text{-}\mu m^2$.

32. The electrical device of claim 31 wherein the specific contact resistance is less than or equal to approximately 100 $\Omega\text{-}\mu m^2$.

33. The electrical device of claim 31 wherein the specific contact resistance is less than or equal to approximately 50 $\Omega\text{-}\mu m^2$.

34. The electrical device of claim 31 wherein the specific contact resistance is less than or equal to approximately 10 $\Omega\text{-}\mu m^2$.

35. The electrical device of claim 31 wherein the specific contact resistance is less than or equal to approximately 1 $\Omega\text{-}\mu m^2$.

36. An electrical device, comprising a junction between a Si-based semiconductor and a conductor separated from the semiconductor by an interface layer having a thickness of less than 1 nm in a vicinity of the junction yet that allows a Fermi level of the conductor to align with a valence band of the semiconductor, wherein the electrical device has a specific contact resistance less than approximately 1000 $\Omega\text{-}\mu m^2$.

37. The electrical device of claim 36 wherein the specific contact resistance is less than or equal to approximately 100 $\Omega\text{-}\mu m^2$.

38. The electrical device of claim 36 wherein the specific contact resistance is less than or equal to approximately 50 $\Omega\text{-}\mu m^2$.

39. The electrical device of claim 36 wherein the specific contact resistance is less than or equal to approximately 10 $\Omega\text{-}\mu m^2$.

40. The electrical device of claim 36 wherein the specific contact resistance is less than or equal to approximately 1 $\Omega\text{-}\mu m^2$.

41. An electrical device, comprising a junction between a Si-based semiconductor and a conductor separated from the semiconductor by an interface layer having a thickness of less than 1 nm in a vicinity of the junction yet that allows a Fermi level of the semiconductor to be independent of a Fermi level of the conductor, wherein the electrical device has a specific contact resistance less than approximately 1000 $\Omega\text{-}\mu m^2$.

42. The electrical device of claim 41 wherein the specific contact resistance is less than or equal to approximately 100 $\Omega\text{-}\mu m^2$.

43. The electrical device of claim 41 wherein the specific contact resistance is less than or equal to approximately 50 $\Omega\text{-}\mu m^2$.

44. The electrical device of claim 41 wherein the specific contact resistance is less than or equal to approximately 10 $\Omega\text{-}\mu m^2$.

45. The electrical device of claim 41 wherein the specific contact resistance is less than or equal to approximately 1 $\Omega\text{-}\mu m^2$.

46. An electrical device, comprising:
a silicon-based semiconductor of either n-type or p-type semiconductor material;
a metal having a workfunction approximately equal to a conduction band of the semiconductor if the semiconductor is of n-type semiconductor material or having a workfunction approximately equal to a valence band of the semiconductor if the semiconductor is of p-type semiconductor material; and an interface layer of less than 1 nm thickness in a vicinity disposed between and in contact with both the semiconductor and the metal, wherein the electrical device has a specific contact resistance of less than or approximately equal to 1000 $\Omega$-$\mu^2$.

47. The electrical device of claim 46 wherein the interface layer includes a passivating material.

48. The electrical device of claim 47 wherein the passivating material comprises one or more of a nitride, a fluoride, an oxide, an oxynitride, a hydride and/or an arsenide of silicon.

49. The electrical device of claim 48 wherein the interface layer consists essentially of a monolayer.

50. The electrical device of claim 47 wherein the interface layer further includes a separation layer.

51. The electrical device of claim 46 wherein the specific contact resistance is less than or equal to approximately 100 $\Omega$-$\mu m^2$.

52. The electrical device of claim 46 wherein the specific contact resistance is less than or equal to approximately 50 $\Omega$-$\mu m^2$.

53. The electrical device of claim 46 wherein the specific contact resistance is less than or equal to approximately 10 $\Omega$-$\mu m^2$.

54. The electrical device of claim 46 wherein the specific contact resistance is less than or equal to approximately 1 $\Omega$-$\mu m^2$.

55. The electrical device of claim 46 wherein the interface layer comprises a passivation layer fabricated by heating the semiconductor in the presence of nitrogenous material.

56. The electrical device of claim 55 wherein the nitrogenous material comprises at least one of ammonia ($NH_3$), nitrogen ($N_2$) or unbound nitrogen (N).

57. An electrical device, comprising:
a silicon-based semiconductor of either n-type or p-type semiconductor material;
a metal having a workfunction near or substantially equal to a conduction band edge of the semiconductor if the semiconductor is of p-type semiconductor material, or having a workfunction near or substantially equal to a valence band edge of the semiconductor if the semiconductor is of n-type semiconductor material; and
an interface layer of less than 1 nm thickness in a vicinity disposed between and in contact with both the semiconductor and the metal and configured to depin a Fermi level of the metal.

58. The electrical device of claim 57 wherein the interface layer includes a passivating material.

59. The electrical device of claim 58 wherein the passivating material comprises one or more of a nitride, a fluoride, an oxide, an oxynitride, a hydride and/or an arsenide of silicon.

60. The electrical device of claim 57 wherein the interface layer consists essentially of a monolayer.

61. The electrical device of claim 57 wherein the interface layer further includes a separation layer.

62. An electrical device, comprising a junction between a Si-based semiconductor and a conductor separated from the semiconductor by an interface layer having a thickness sufficient to depin a Fermi level of the conductor in a vicinity of the junction yet thin enough to provide the junction with a specific contact resistance that is generally dependent on the workfunction of the conductor.

63. The electrical device of claim 62 wherein the interface layer includes a passivating material.

64. The electrical device of claim 63 wherein the passivating material comprises one or more of a nitride, a fluoride, an oxide, an oxynitride, a hydride and/or an arsenide of silicon.

65. The electrical device of claim 63 wherein the interface layer consists essentially of a monolayer.

66. The electrical device of claim 63 wherein the interface layer further includes a separation layer.

67. The electrical device of claim 62 wherein the interface layer comprises a passivation the semiconductor in the presence of nitrogenous material.

68. The electrical device of claim 67 wherein the nitrogenous material comprises one of: ammonia ($NH_3$), nitrogen ($N_2$), or unbound nitrogen (N).

69. The electrical device of claim 62 wherein the interface layer includes a passivation layer grown by immersion of the semiconductor in a liquid containing hydrogen and fluorine ions.

* * * * *